US006614314B2

(12) United States Patent  
d'Haene et al.

(10) Patent No.: US 6,614,314 B2
(45) Date of Patent: Sep. 2, 2003

(54) NON-LINEAR PHASE DETECTOR

(75) Inventors: Wesley Calvin d'Haene, Burlington (CA); Atul Krishna Gupta, Mississauga (CA)

(73) Assignee: Gennum Corporation (CA)

( * ) Notice: Subject to any disclaimer, the term of this patent is extended or adjusted under 35 U.S.C. 154(b) by 36 days.

(21) Appl. No.: 10/006,500

(22) Filed: Dec. 3, 2001

(65) Prior Publication Data

US 2003/0102928 A1 Jun. 5, 2003

(51) Int. Cl.[7] .......................... H03L 7/085; H03D 13/00
(52) U.S. Cl. .................. 331/1 A; 331/25; 327/9; 327/12; 327/156; 327/159
(58) Field of Search .......................... 331/1 A, 25, 172; 327/2, 3, 9, 12, 156–159

(56) References Cited

U.S. PATENT DOCUMENTS

| | | |
|---|---|---|
| 5,126,602 A | 6/1992 | Lee et al. |
| 5,592,125 A | 1/1997 | Williams |
| 5,923,190 A * | 7/1999 | Yamaguchi .................. 327/12 |
| 6,072,336 A * | 6/2000 | Yamaguchi .................. 327/12 |

FOREIGN PATENT DOCUMENTS

EP        92301224.9        8/1992

OTHER PUBLICATIONS

Alexander, J.D.H., "Clock Recovery From Random Binary Signals", Electronics Letters, vol. 11, pp. 242–243, Oct. 1975.

Greshishchev, Yuriy, Schvan, Peter, Showell, Jonathan, Xu, Mu–Liang, Ojha, Jugnu and Rogers, Jonathan, "A Fully Integrated SiGe Receiver IC for 10–Gb/s Data Rate", IEEE Journal of Solid State Circuits, vol. 35, No. 12, pp. 1949–1957, Dec. 2000.

* cited by examiner

Primary Examiner—David C. Mis
(74) Attorney, Agent, or Firm—Jones Day

(57) ABSTRACT

A non-linear phase detector includes a retiming stage and a phase synchronization stage. The retiming stage is coupled to a data signal and a recovered clock signal. The retiming stage is triggered by the recovered clock signal and samples the data signal to generate a retimed data signal and a clock synchronization signal. The phase synchronization stage is coupled to the retimed data signal and the clock synchronization signal. The phase synchronization stage is triggered by the retimed data signal and samples the clock synchronization signal to generate a phase control signal.

111 Claims, 9 Drawing Sheets

NON-LINEAR PHASE DETECTOR

FIELD OF THE INVENTION

This invention relates generally to the field of phase detectors. More particularly, a non-linear phase detector is provided that is especially well-suited for use in high-speed, high-performance clock and data recovery circuits.

BACKGROUND OF THE INVENTION

The use of a non-linear phase detector in a clock and data recovery circuit is known. For instance, a tri-state phase detector is shown in J. D. H. Alexander, *Clock Recovery from Random Binary Signals*, Electronic Letters, Vol. 11, October 1975, at 541. Known phase detectors, however, include many disadvantages that are overcome by the present invention.

Clock and data recovery circuits are typically implemented using a phase locked loop (PLL) that recovers a clock signal from a binary input signal by synchronizing a local clock signal with the rising and/or falling edges of the binary input signal. FIG. 1 is a diagram of a typical phase locked loop 10 (PLL) configured as a clock and data recovery circuit. The PLL 10 includes a phase detector 12, a charge pump 14, a loop filter 16 and a voltage controlled oscillator 18.

Operationally, the phase detector 12 receives an input data signal 22, which is typically a binary NRZ (non-return to zero) data stream, and compares the rising and/or falling edges of the input data signal 22 with the rising and/or falling edges of a locally-generated (recovered) clock signal 20 in order to generate a phase detector output signal 26. The phase detector output signal 26 typically indicates whether the rising and/or falling edges of the recovered clock signal 20 occur before (lagging clock) or after (leading clock) the rising and/or falling edges of the binary input data signal 22. In addition, a typical phase detector 12 may also include a decision circuit (i.e. a retiming or reclocking flip-flop) which may utilize the recovered clock signal 20 to sample the input data signal 22 in order to reduce or remove random phase deviations (jitter) and generate a reclocked data signal output 24. The phase detector output signal 26 is coupled to the charge pump 14, which typically generates either a positive or negative output, depending upon whether the recovered clock signal 20 is leading or lagging. The charge pump output is then processed by the loop filter 16 and coupled to the voltage controlled oscillator 18, which generates the recovered clock signal 20 that is fed back to the phase detector 12.

SUMMARY

A non-linear phase detector includes a retiming stage and a phase synchronization stage. The retiming stage is coupled to a data signal and a recovered clock signal. The retiming stage is triggered by the recovered clock signal and samples the data signal to generate a retimed data signal and a clock synchronization signal. The phase synchronization stage is coupled to the retimed data signal and the clock synchronization signal. The phase synchronization stage is triggered by the retimed data signal and samples the clock synchronization signal to generate a phase control signal. This configuration optimizes the input jitter tolerance (IJT) of the retiming stage.

DETAILED DESCRIPTION

Figure 2:
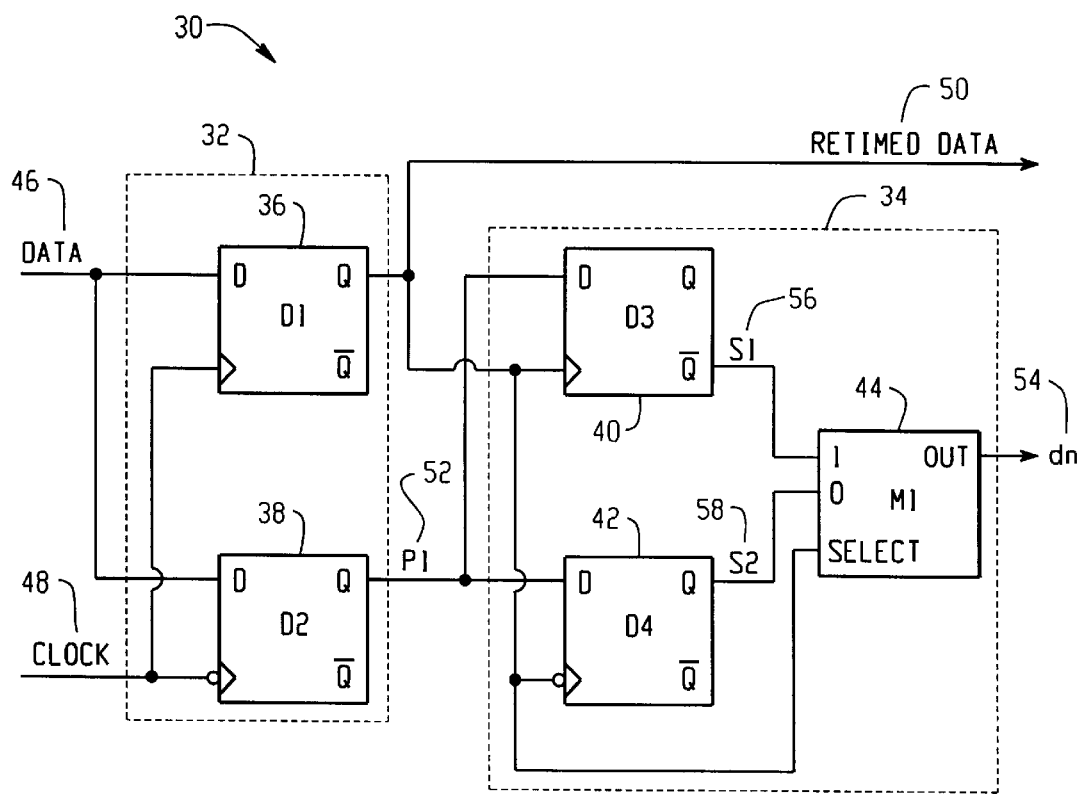
FIG. 2 is an exemplary embodiment of a non-linear phase detector.

Referring now to the remaining drawing figures, FIG. 2 is an exemplary embodiment of a non-linear phase detector 30. The non-linear phase detector 30 includes a retiming stage 32 and a phase synchronization stage 34. The retiming stage 32 preferably includes a first latch (D1) 36 and a second latch (D2) 38. The phase synchronization stage 34 preferably includes a third latch (D3) 40, a fourth latch (D4) 42, and a multiplexer (M1) 44. The latches 36–42 are preferably D-type flip-flops having a data input (D), a clock input, a true output (Q) and an inverted output (Q). In alternative embodiments, however, the latches 36–42 could be implemented with other types of state devices, such as J-type flip-flops, R-S flip-flops, or shift registers. The multiplexer (M1) 44 is preferably a two-line to one-line data selector/multiplexer, but may be implemented in alternative embodiments using other types of multiplexers, or possibly using a logic device or combination of logic devices.

Figure 1:
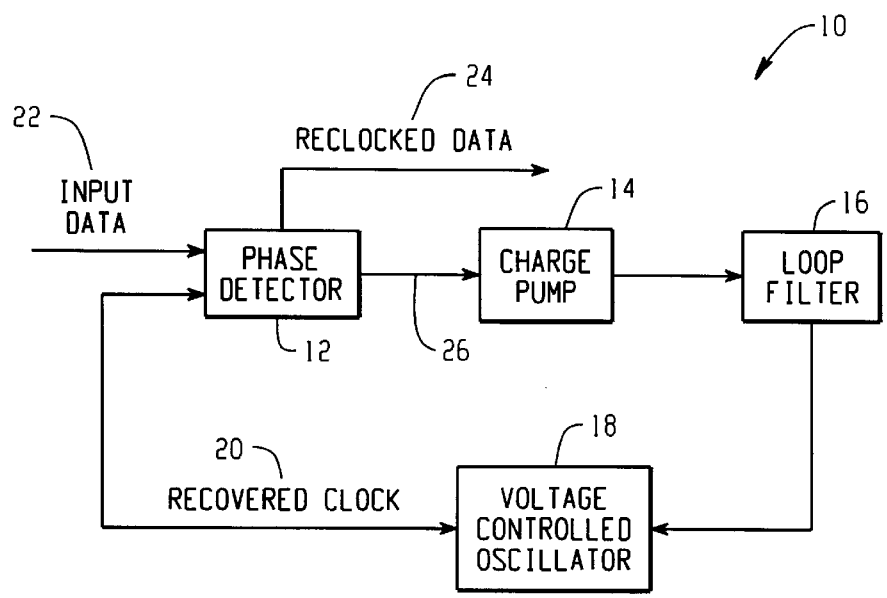
FIG. 1 is a diagram of a typical phase locked loop (PLL) configured as a clock and data recovery circuit.

The retiming stage 32 is coupled to a data signal 46 and a recovered clock signal 48, and samples the data signal 46 on the rising and falling edges of the recovered clock signal 48 in order to generate a retimed data signal 50 and a clock synchronization signal (P1) 52. The data signal 46 is preferably a binary NRZ data stream. The recovered clock signal 48 and the data signal 46 may, for example, be the recovered clock signal 20 and the input data signal 22 of a clock and data recovery circuit 10, as described above with reference to FIG. 1. It should be understood, however, that the non-linear phase detector 30 is not limited to implementation as the phase detector 12 in a clock and data recovery circuit 10. Rather, the non-linear phase detector 30 may have utility in other circuits, such as a PLL configured as a frequency synthesizer, or a delay locked loop (DLL).

Within the retiming stage 32, the data signal 46 is coupled to the data input (D) of the first and second latches 36, 38. The recovered clock signal 48 is coupled to the clock input of the first latch (D1) 36, and a logical inversion of the recovered clock signal 48 is coupled to the clock input of the second latch (D2) 38. The first latch (D1) 36 preferably samples the data signal 46 at the rising edge of the recovered clock signal 48 to generate the retimed data signal 50. Similarly, the second latch (D2) 38 preferably samples the data signal 46 at the falling edge of the recovered clock signal 48 to generate the clock synchronization signal (P1) 52.

The phase synchronization stage 34 is coupled to the retimed data signal 50 and the clock synchronization signal (P1) 52, and samples the clock synchronization signal (P1) 52 on the rising and falling edges of the retimed data signal 50 in order to generate a phase control signal (dn) 54. The phase control signal (dn) 54 may, for example, be coupled to the charge pump 14 in a clock and data recovery circuit 10 in order to synchronize the recovered clock signal 48 with the data signal 46. The retimed data signal 50 may, for example, be the reclocked data output 24 from a clock and data recovery circuit 10 as described above.

Within the phase synchronization stage 34, the latches (D3 and D4) 40, 42 and the multiplexer (M1) 44 combine to form a dual-edge triggered flip-flop. The clock synchronization signal (P1) 52 is coupled to the data input (D) of the third and fourth latches 40, 42. The retimed data signal 50 is coupled to the clock input of the third latch (D3) 40, and a logical inversion of the retimed data signal 50 is coupled to the clock input of the fourth latch (D4) 42. At the rising edge of the retimed data signal 50, the third latch (D3) 40 samples the clock synchronization signal (P1) 52 at its inverted output ($\overline{Q}$) to generate a first sync signal (S1) 56. At the falling edge of the retimed data signal 50, the fourth latch (D4) 42 samples the clock synchronization signal (P1) 52 at its true output (Q) to generate a second sync signal (S2) 58. The first and second sync signals 56, 58 are then coupled to the data inputs of the multiplexer (M1) 44, and the retimed data signal 50 is fed forward as a select input to the multiplexer (M1) 44. When the multiplexer (M1) 44 detects the rising edge of the retimed data signal 50 at its select input, the first sync signal (S1) 56 is selected as the phase control signal (dn) 54 output from the multiplexer (M1) 44. Similarly, when the falling edge of the retimed data signal 50 is detected at the select input of the multiplexer (M1) 44, the second sync signal (S2) 58 is selected as the phase control signal (dn) 54. A low logic level output on the phase control signal (dn) 54 indicates that the recovered clock signal 48 is lagging the data signal 46, and a high logic level output on the phase control signal (dn) 54 indicates that the recovered clock signal 48 is leading the data signal 46.

In an alternative embodiment, the non-linear phase detector 30 could be reconfigured to generate an up phase control signal, instead of the illustrated phase control signal (dn) 54. This alternative embodiment could be implemented, for example, by utilizing the true output (Q) of the third latch (D3) 40 as the first sync signal (S1) 56, and utilizing the inverted output ($\overline{Q}$) of the fourth latch (D4) 42 as the second sync signal (S2) 58. A high logic level on an up phase control signal would then indicate a lagging clock, and a low logic level would indicate a leading clock. It is also noted that alternative embodiments can be implemented through the use of differential signals and circuits. As a result, variations of the circuit 30 which use inverted signals at various points can be achieved without the addition of an explicit inverter circuit.

Figure 3:
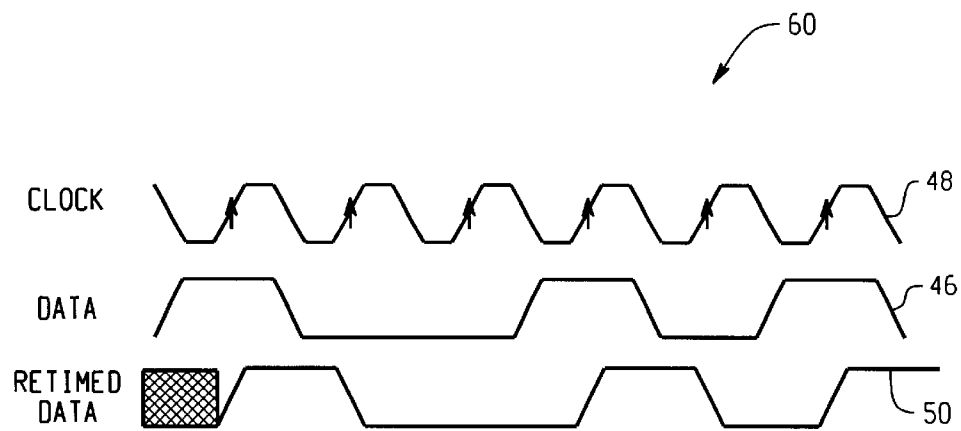
FIG. 3 is a timing diagram illustrating the ideal phase alignment between the data signal, the recovered clock signal, and the retimed data signal.

FIG. 3 is a timing diagram 60 illustrating the ideal phase alignment between the data signal 46, the recovered clock signal 48, and the retimed data signal 50, for ideal latches.

A data signal 46 consisting of NRZ coded data should ideally be phase-aligned with the recovered clock signal 48, such that one edge of the recovered clock signal 48 (e.g., falling edge) is aligned to the edge transitions of the data signal 46. For example, as illustrated in the timing diagram 60, both the rising and falling edges of the data signal 46 occur at a falling edge of the recovered clock signal 48.

Figure 3A:
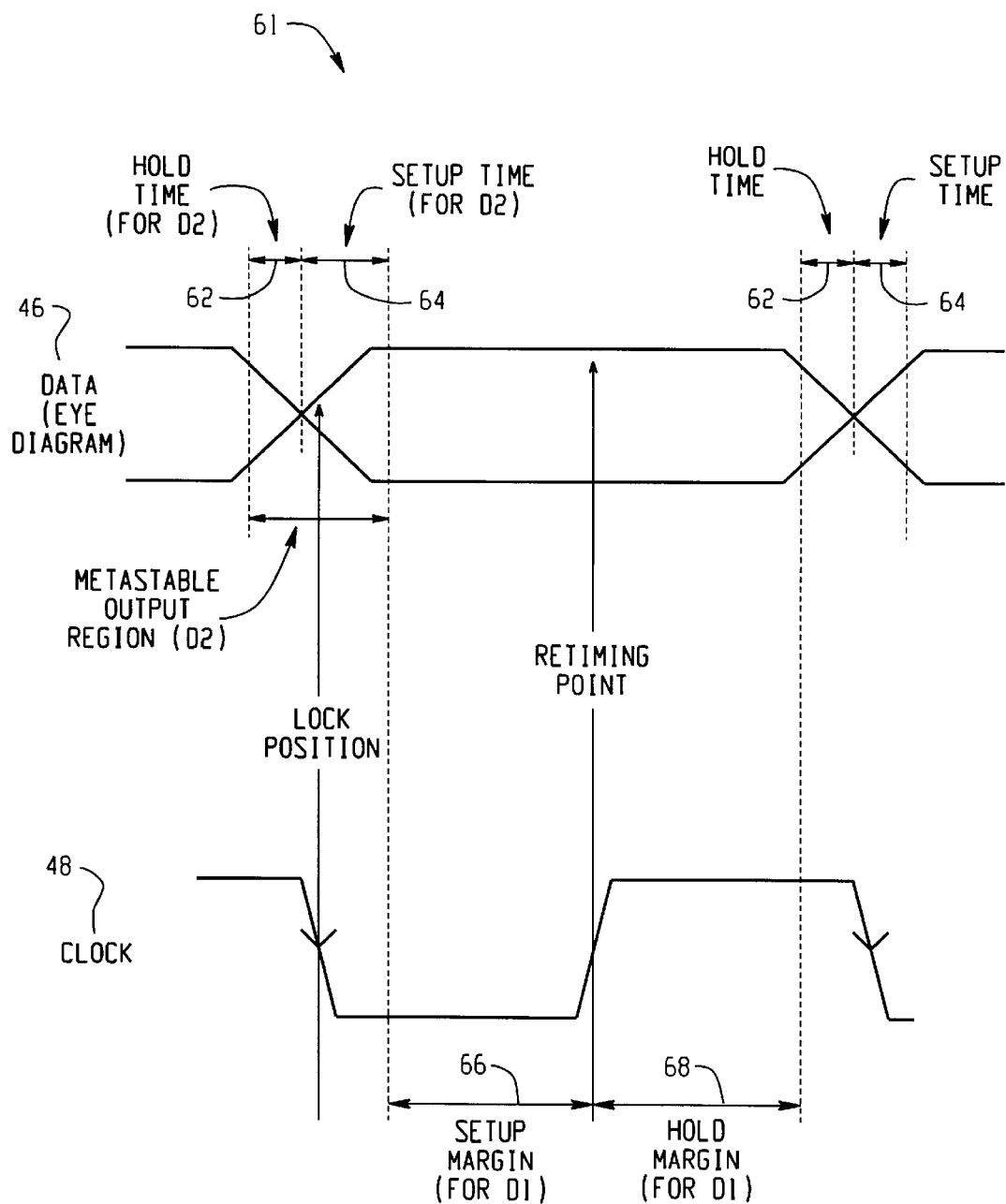
FIG. 3a is a timing diagram illustrating a synchronized phase alignment between the data signal and the recovered clock signal in a non-linear phase detector, taking into consideration the non-idealities of the latches.

FIG. 3a is a timing diagram illustrating a synchronized phase alignment between the data signal 46 and the recovered clock signal 48 in a non-linear phase detector 30, taking into consideration the non-idealities of the latches 36–42. A latch that samples the data signal 46, such as the first latch (D2) 38, will have a metastable output, on average, in a synchronized PLL system. Since non-ideal latches have some finite setup and hold time requirements, when the recovered clock signal 48 and the data signal 46 are locked in synchronization, one clock edge will preferably be centered in the middle of the setup and hold time requirements 62, 64 (i.e. the center of the metastable region) of the second latch (D2) 38. This results in equal (or substantially equal) setup and hold time margins 66, 68 for the first latch (D1) 36 that samples the data signal 46 on the opposite clock edge. In this manner, the setup and hold time margins 66, 68 for the first latch (D1) 36 are maximized. Because of the ample margin available to meet setup and hold time requirements in first latch (D1) 36, potential bit errors are eliminated for cases when the data signal 46 has large jitter with respect to the recovered clock signal 48.

Figure 4:
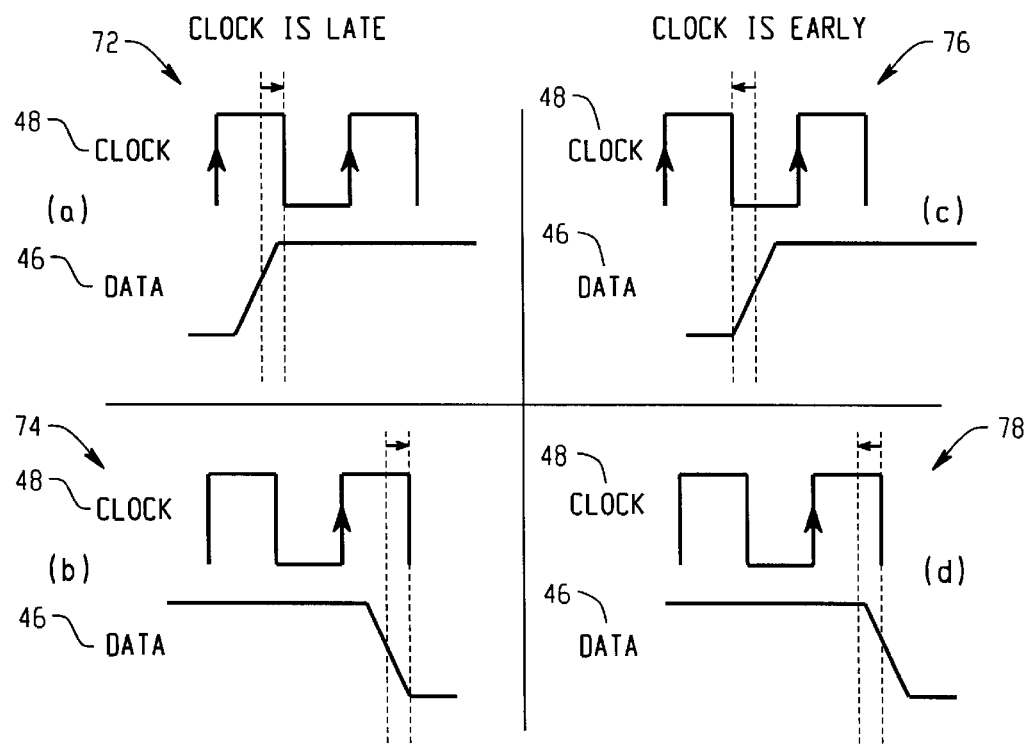
FIGS. 4(a) through 4(d) are timing diagrams illustrating four possible conditions of phase misalignment between the recovered clock signal and the data signal.

In order to closely approximate the ideal phase alignment illustrated in FIG. 3, the non-linear phase detector 30 detects whether the phase of the recovered clock signal 48 is early or late (leading or lagging) with respect to the phase of the data signal 46, and generates the phase control signal (dn) 54 to compensate for any phase misalignment. FIGS. 4(a) through 4(d) are timing diagrams 72, 74, 76, 78 illustrating four possible conditions of phase misalignment between the recovered clock signal 48 and the data signal 46. In FIGS. 4(a) and 4(b), the phase of the recovered clock signal 48 is late (lagging) with respect to the phase of the data signal 46. In FIG. 4(a), the falling edge of the recovered clock signal 48 is late because it occurs after the threshold voltage in the rising edge of the data signal 46. Similarly, in FIG. 4(b), the falling edge of the recovered clock signal 48 is late because it occurs after the threshold voltage in the falling edge of the data signal 46. In FIGS. 4(c) and 4(d), the phase of the recovered clock signal 48 is early (leading) with respect to the phase of the data signal 46. In FIG. 4(c), the falling edge of the recovered clock signal 48 is early because it occurs before the threshold voltage in the rising edge of the data signal 46. Similarly, in FIG. 4(d), the falling edge of the recovered clock signal 48 is early because it occurs before the threshold voltage in the falling edge of the data signal 46.

Figure 5:
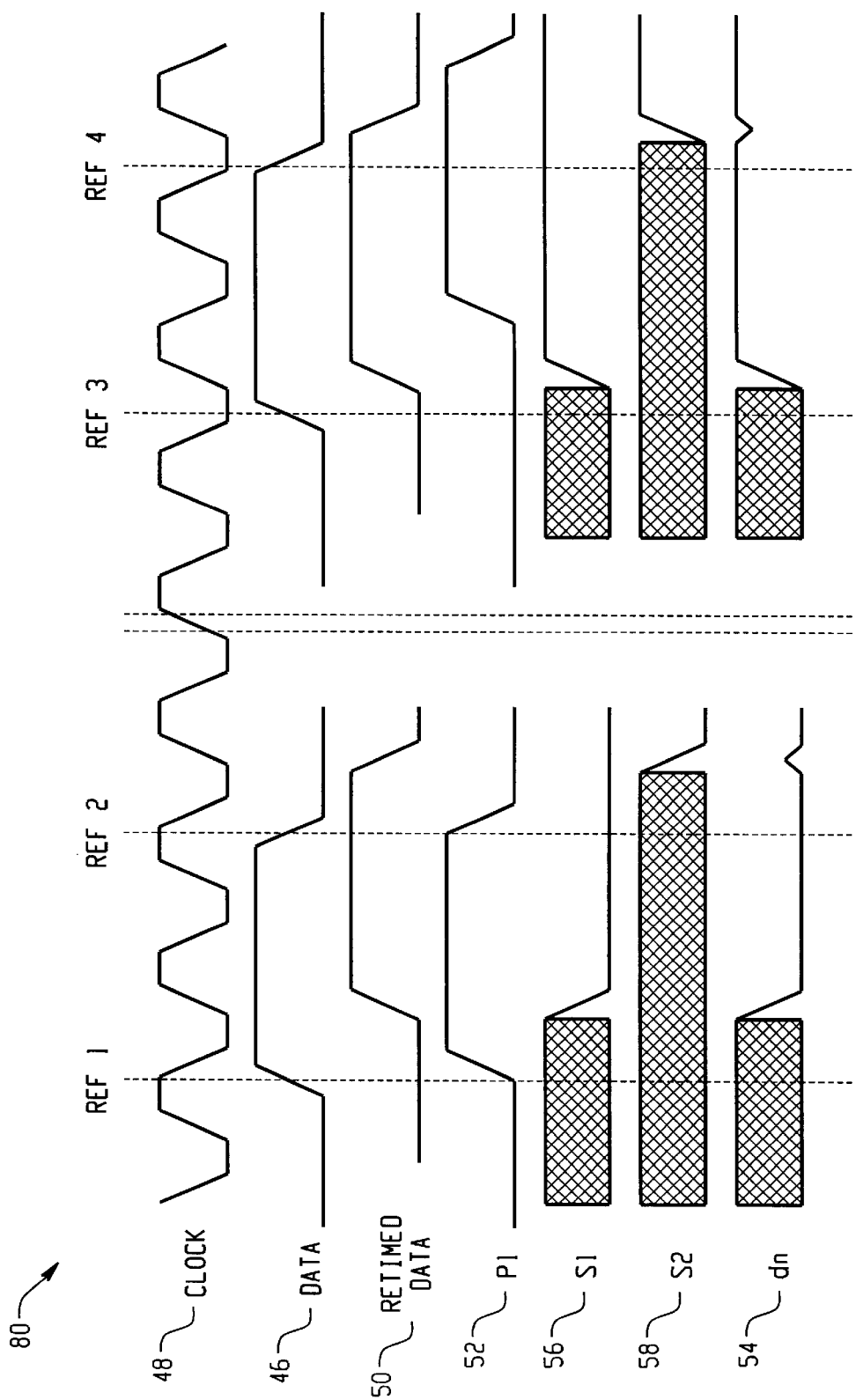
FIG. 5 is a timing diagram illustrating the operation of the non-linear phase detector at four conditions of phase misalignment between the recovered clock signal and the data signal.

FIG. 5 is a timing diagram 80 illustrating the operation of the non-linear phase detector 30 at four conditions of phase misalignment between the recovered clock signal 48 and the data signal 46. The timing diagram 80 includes the recovered clock signal 48, the data signal 46, the retimed data signal 50, the clock synchronization signal (P1) 52, the first sync signal (S1) 56, the second sync signal (S2) 58, and the phase control signal (dn) 54. The diagram 80 also includes four vertical dotted lines, designated as REF1–REF4, that reference four conditions of misalignment between the recovered clock signal 48 and the data signal 46. Cross-referencing FIG. 5 with FIGS. 4(a)–4(d), REF1 corresponds to the condition of misalignment shown in FIG. 4(a), REF2 corresponds to the condition of misalignment shown in FIG. 4(b), REF3 corresponds to the condition of misalignment in FIG. 4(c), and REF4 corresponds to the condition of misalignment in FIG. 4(d).

At reference points REF1 and REF2, the falling edges of the recovered clock signal 48 occur after the transitional edges of the data signal 46, illustrating a lagging clock. This phase misalignment causes the retimed data signal 50 to lag the clock synchronization signal (P1) 53, resulting in a low output (indicating a lagging clock) on the phase control output signal (dn) 54.

At reference points REF3 and REF4, the falling edges of the recovered clock signal 48 occur before the transitional edges of the data signal 46, illustrating a leading clock. As a result of this phase misalignment, the retimed data signal 50 leads the clock synchronization signal (P1) 53, resulting in a high output (indicating a leading clock) on the phase control signal (dn) 54.

Figure 6:
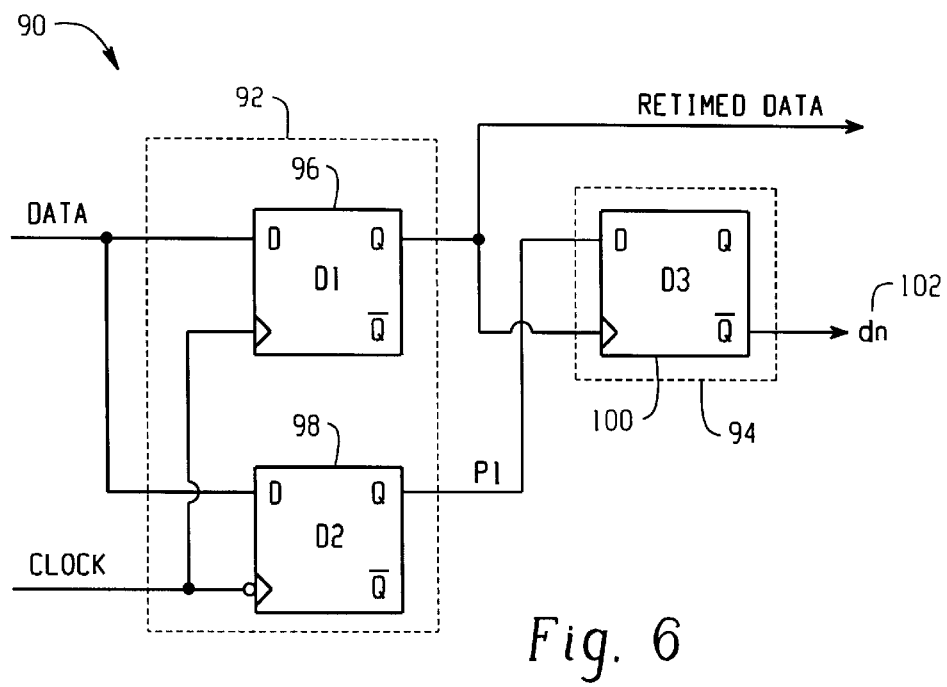
FIG. 6 is an alternative embodiment of a non-linear phase detector.

FIG. 6 is an alternative embodiment 90 of a non-linear phase detector. Similar to the phase detector 30 described above with reference to FIG. 2, this embodiment 90 includes a retiming stage 92 and a phase synchronization stage 94. The retiming stage 92 includes a first latch (D1) 96 and a second latch (D2) 98, and preferably operates the same as the retiming stage 32 described above with reference to FIG. 2. The phase synchronization stage 94 in this embodiment 90, however, includes only one latch (D3) 100. The latch (D3) 100 in the phase synchronization stage 94 of this alternative embodiment 90 preferably operates similarly to the third latch (D3) 40 described above with reference to FIG. 2, except the inverted output ($\overline{Q}$) from the latch (D3) 100 serves as the phase control signal (dn) 102.

Referring again to FIG. 5, the timing diagram 80 illustrates that the phase control signal (dn) 54 is substantially the same as the first sync output (S1) 56. Thus, the alternative embodiment 90 shown in FIG. 6 simplifies the circuit by utilizing the first sync output (S1) 56 as the phase control signal (dn) 102. One skilled in the art will appreciate, however, that this simplified embodiment 90 only updates the phase control signal (dn) 102 at the rising edge of the retimed data signal 50. As a result, this embodiment 90 may, for example, be used for clock and data recovery in a system in which the input data signal 46 is a RZ (return to zero) or CMI (coded mark inversion) coded signal, as well as systems utilizing a NRZ data stream. In addition, this alternative embodiment 90 is not sensitive to duty cycle distortion (i.e., the bit period of a "1" is slightly more or less than that of a "0") that may be present in the input data signal 46.

In another alternative embodiment, the simplified non-linear phase detector 90 shown in FIG. 6 may be modified to update the phase control signal (dn) on the falling edge of the retimed data signal 50. This falling-edge-triggered embodiment may be achieved by inverting the clock input to the latch (D3) 100, and utilizing the true output (Q) as the phase control signal (dn). With reference again to FIG. 5, the phase control signal (dn) output of the falling-edge-triggered embodiment would correspond to the second sync signal (S2) 58.

Figure 7:
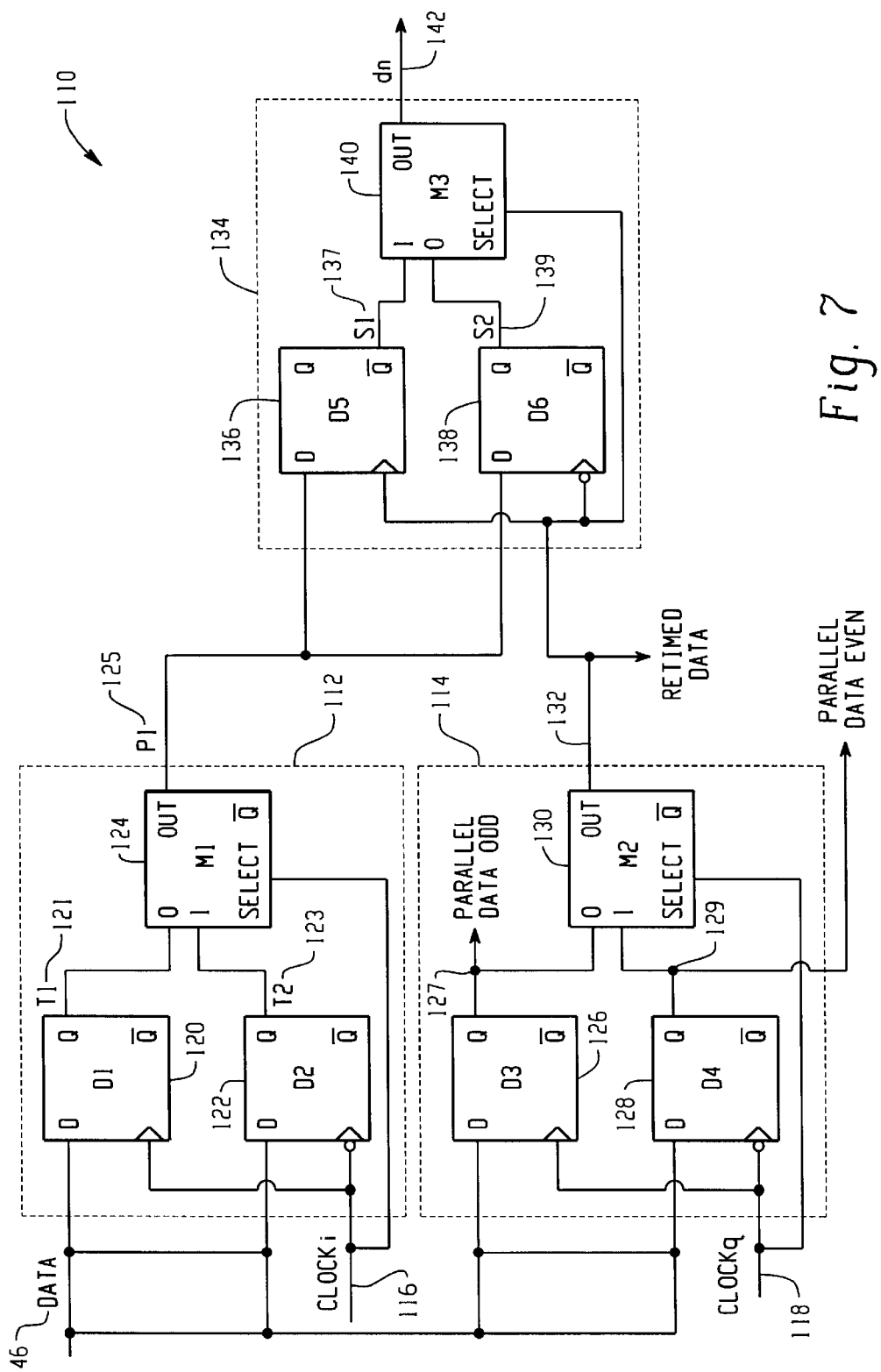
FIG. 7 is an exemplary embodiment of a half clock-rate, non-linear phase detector.

FIG. 7 is an exemplary embodiment of a half clock-rate, non-linear phase detector 110. This half clock-rate embodiment 110 is similar to the non-linear phase detector 30 described above with reference to FIG. 2, except the first and second latches (D1 and D2) 36, 38 in the retiming stage 32 are replaced with a first timing stage 112 and a second timing stage 114 that are respectively clocked by an in-phase 116 and a quadrature-phase 118 clock signal. The first and second timing stages 112, 114 are preferably dual-edge triggered flip-flops. The in-phase and quadrature-phase clock signals 116, 118 are each preferably half the frequency of the recovered clock signal 48, and the quadrature-phase clock signal 118 is ninety degrees (90°) out of phase with the in-phase clock signal 116. In an alternative embodiment, however, the in-phase and quadrature-phase clock signals 116, 188 may be reversed, such that the first timing stage 112 is clocked by the quadrature-phase clock signal 118 and the second timing stage 114 is clocked by the in-phase clock signal. The in-phase and quadrature-phase clock signals 116, 118 may, for example, be generated by dividing the recovered clock signal 48, coupling the recovered clock signal 48 to a delay element, modifying the voltage controlled oscillator 18 element in a PLL 10, or by some other means.

The first timing stage 112 preferably includes a first latch (D1) 120, a second latch (D2) 122 and a first multiplexer (M1) 124. The first latch (D1) 120 is preferably coupled to the data signal 46 at its data input (D) and the in-phase clock signal 116 at its clock input, and preferably samples the data signal 46 at the rising edge of the in-phase clock signal 116 to generate a first timing signal (T1) 121. The second latch (D2) 122 is preferably coupled to the data signal 46 at its data input (D) and a logical inversion of the in-phase clock signal at its clock input, and preferably samples the data signal 46 at the falling edge of the in-phase clock signal to generate a second timing signal (T2) 123. The first and second timing signals (T1 and T2) 121, 123 are coupled as the data inputs to the first multiplexer (M1) 124, and the in-phase clock signal 116 is fed forward as the select input to the first multiplexer (M1) 124. The first multiplexer (M1) 124 selects either the first or the second timing signal (T1 or T2) as the clock synchronization signal (P1) 125 depending upon the state of the in-phase clock signal 116 at the select input. Preferably, the first multiplexer (M1) selects the first timing signal (T1) 121 as the clock synchronization signal (P1) 125 when the select input is low, and selects the second timing signal (T2) 123 as the clock synchronization signal (P1) 125 when the select input is high.

The second timing stage 114 preferably includes a third latch (D3) 126, a fourth latch (D4) 128 and a second multiplexer (M2) 130. The third latch (D3) 126 is preferably coupled to the data signal 46 at its data input (D) and the quadrature-phase clock signal 118 at its clock input, and preferably samples the data signal 46 at the rising edge of the quadrature-phase clock signal 118 to generate an odd parallel data signal 127. The fourth latch (D4) 128 is preferably coupled to the data signal 46 at its data input (D) and a logical inversion of the quadrature-phase clock signal at its clock input, and samples the data signal 46 on a falling edge of the quadrature-phase clock signal to generate an even parallel data signal 129. The odd and even parallel data signals 127, 129 are coupled as the data inputs to the second multiplexer (M2) 130, and the quadrature-phase clock signal 118 is coupled as the select input. The multiplexer (M2) 130 preferably selects one of the odd or even parallel data signals 127, 129 as the retimed data signal 132 based on the state of the quadrature-phase clock signal 118 at the select input. Preferably, the second multiplexer (M2) 130 selects the odd parallel data signal 127 as the retimed data signal 132 when the select input is low, and selects the even parallel data signal 129 as the retimed data signal 132 when the select input is high.

In a preferred embodiment, the odd and even parallel data signals 127, 129 are also coupled as additional outputs from the phase detector 110. One skilled in the art will appreciate that the odd and even parallel signals 127, 129 divide the serial data input signal 46 into a two-bit parallel data signal.

The phase synchronization stage 134 is preferably the same as the phase synchronization stage 34 described above with reference to FIG. 2, and includes a fifth latch (D5) 136, a sixth latch (D6) 138 and a third multiplexer (M3) 140. The fifth latch (D5) 136 preferably samples the clock synchronization signal (P1) 125 on the rising edge of the retimed data signal 132 to generate the first sync signal (S1) 137, and the sixth latch (D6) 138 preferably samples the clock synchronization signal (P1) 125 on the falling edge of the retimed data signal 132 to generate the second sync signal (S2) 139. The retimed data signal 132 is also fed forward to the select input of the third multiplexer (M3) 140 which, based on the state of the select input, selects one of the first or the second sync signals (S1 or S2) 137, 139 as the phase control signal (dn) 142.

Figure 8:
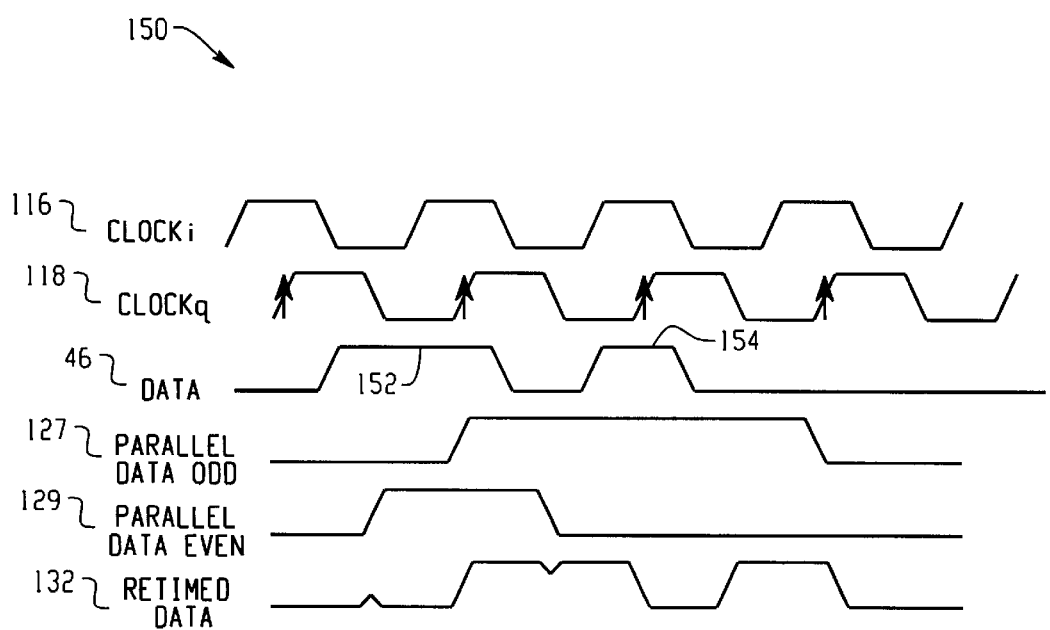
FIG. 8 is a timing diagram illustrating the ideal phase alignment between various signals in the half clock-rate, non-linear phase detector.

FIG. 8 is a timing diagram 150 illustrating the ideal phase alignment between various signals in the half clock-rate, non-linear phase detector 110, for ideal latches. The data signal 46 should ideally be phase aligned with the in-phase clock signal 116, such that each transitional edge (rising or falling) of the data signal 46 is aligned with one transitional edge (rising or falling) of the in-phase clock signal 116. For instance, the data signal 46 illustrated in FIG. 8 has two data pulses 152, 154. In the first data pulse 152, both the rising and falling edges of the data pulse 152 are aligned with a falling edge of the in-phase clock signal. In the second data pulse 154, the rising edge of the data pulse 154 is aligned with a rising edge of the in-phase clock signal 116, and the falling edge of the data pulse 154 is aligned with a falling edge of the in-phase clock signal 116.

Figure 9A:
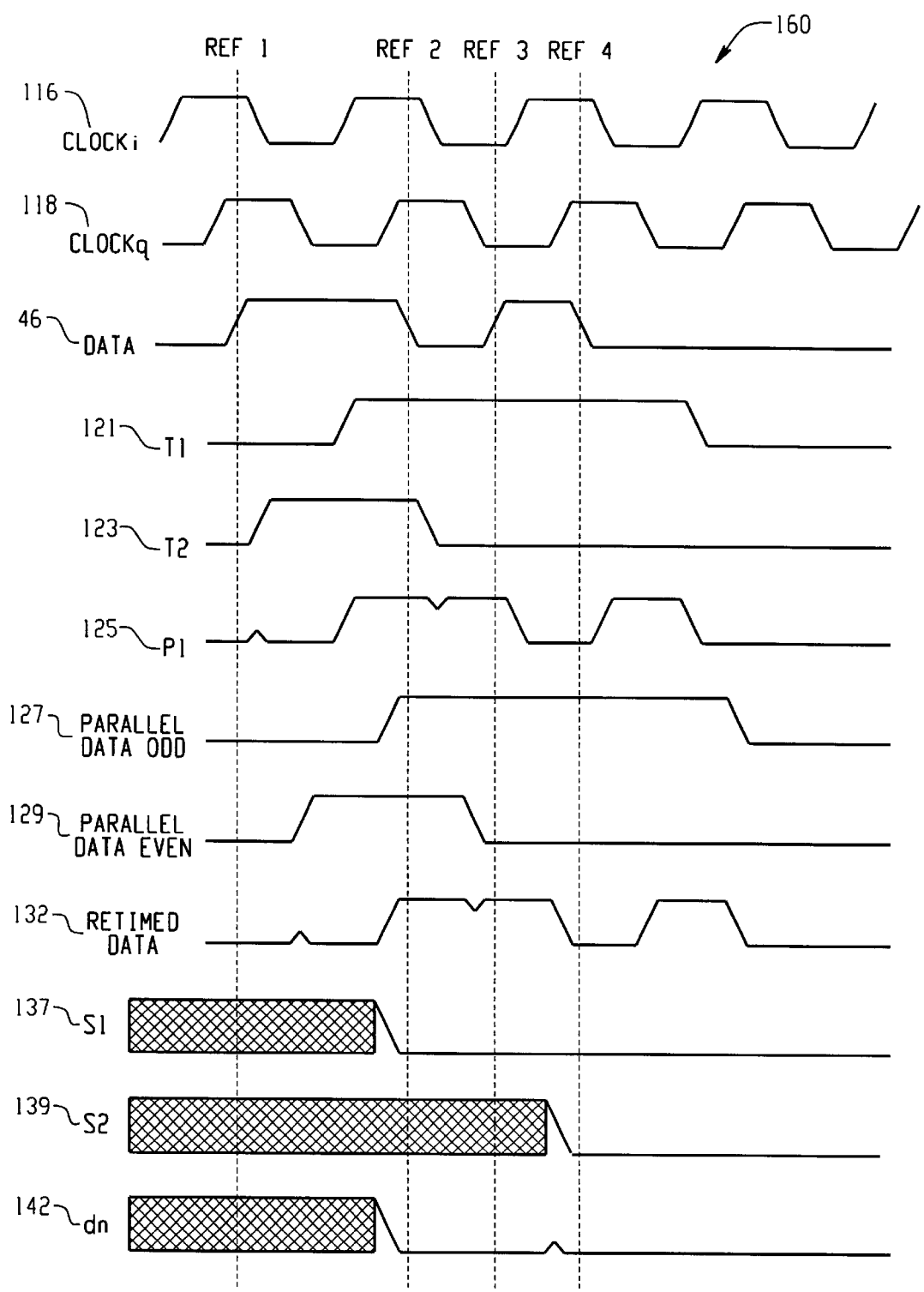
FIGS. 9(a) and 9(b) are timing diagrams illustrating the operation of the half clock-rate, non-linear phase detector.
Figure 9B:
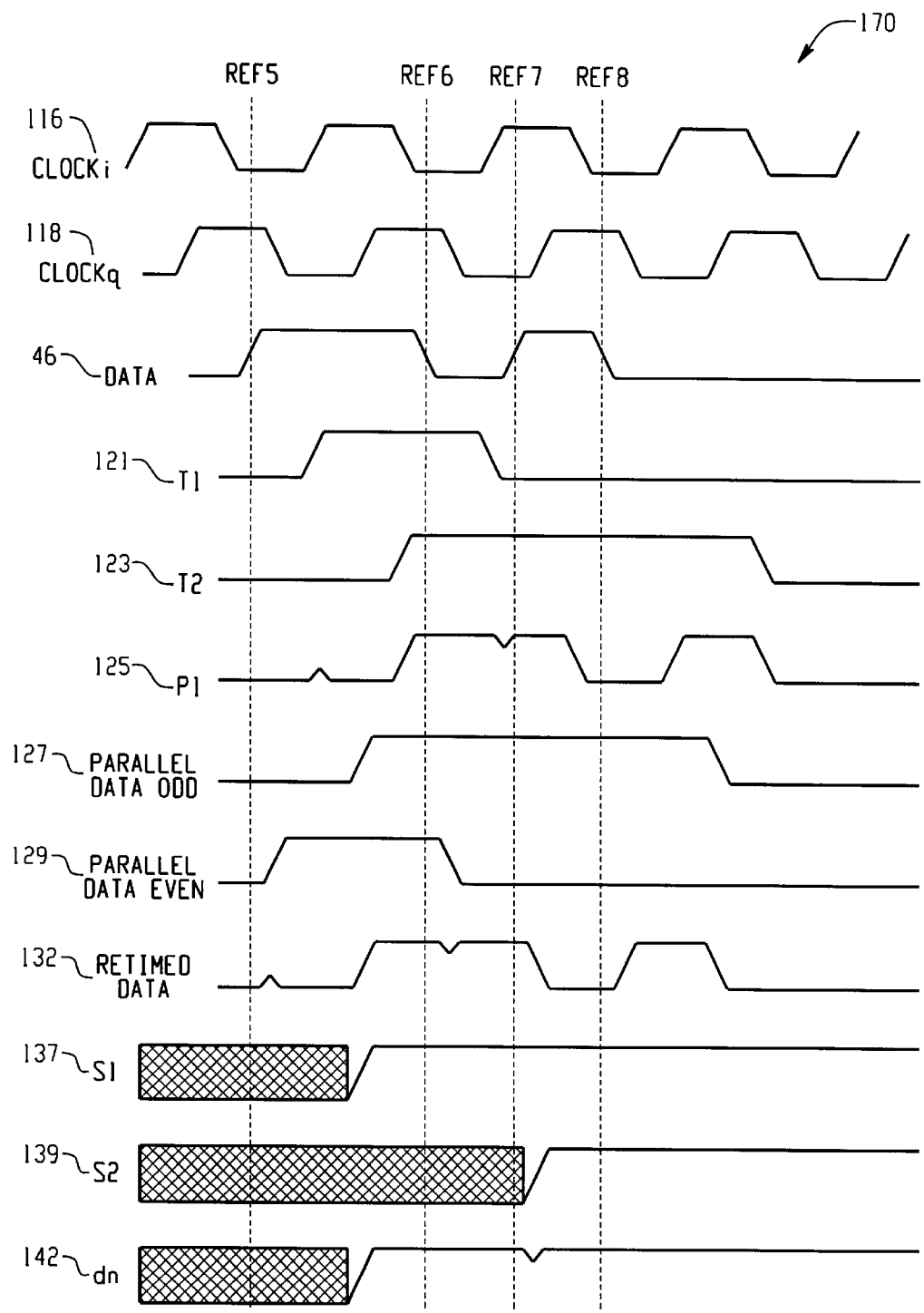

FIGS. 9(a) and 9(b) are timing diagrams 160, 170 illustrating the operation of the half clock-rate, non-linear phase detector 110. The timing diagrams 160, 170 both include the in-phase clock signal 116, the quadrature-phase clock signal 118, the data signal 46, the first and second timing signals (T1 and T2) 121, 123, the clock synchronization signal (P1) 125, the odd and even parallel data signals 127, 129, the retimed data signal 132, the first and second sync signals (S1 and S2) 137, 139, and the phase control signal (dn) 142. FIG. 9(a) also includes four vertical dotted lines, designated as REF1–REF4, that reference four points at which a transitional edge of the in-phase clock signal 116 lags a transitional edge of the data signal 46. Similarly, FIG. 9(b) includes four vertical dotted lines, designated as REF5–REF8, that reference points at which a transitional edge of the in-phase clock signal 116 leads a transitional edge of the data signal 46.

FIG. 9(a) illustrates the operation of the half clock-rate, non-linear phase detector when the phase of the in-phase clock signal is lagging the phase of the data signal 46. Four transitional edges of the data signal 46 occur at reference points REF1–REF4, respectively. Ideally, either a rising or a falling edge of the in-phase clock signal 116 should align with a transitional edge of the data signal 46 at each of these reference points REF1–REF4. Because the clock signals 116, 118 are lagging their ideal phase alignment, however, the transitional edges of the in-phase clock signal 116 occur after the reference points REF1–REF4. Therefore, after each reference point REF1–REF4, a transitional edge of the in-phase clock signal 116 occurs before a transitional edge of the quadrature-phase clock signal 118. This phase misalignment causes the clock synchronization signal (P1) 125 to lead the retimed data signal 132, resulting in a low output (indicating a lagging clock) on the phase control signal (dn) 142.

FIG. 9(b) illustrates the operation of the half clock-rate, non-linear phase detector when the phase of the in-phase clock signal 116 is leading the phase of the data signal 46. The transitional edges of the data signal 46 are illustrated at reference points REF5–REF8. Because the clock signals 116, 118 are leading their ideal phase alignments, the transitional edges of the in-phase clock signal 116 occur before the reference points REF5–REF8, while the corresponding transitional edges of the quadrature-phase clock signal 118 occur after the reference points REF5–REF8. This phase misalignment causes the clock synchronization signal (P1) 125 to lag the retimed data signal 132, resulting in a high output (indicating a leading clock) on the phase control signal (dn) 142.

Figure 10:
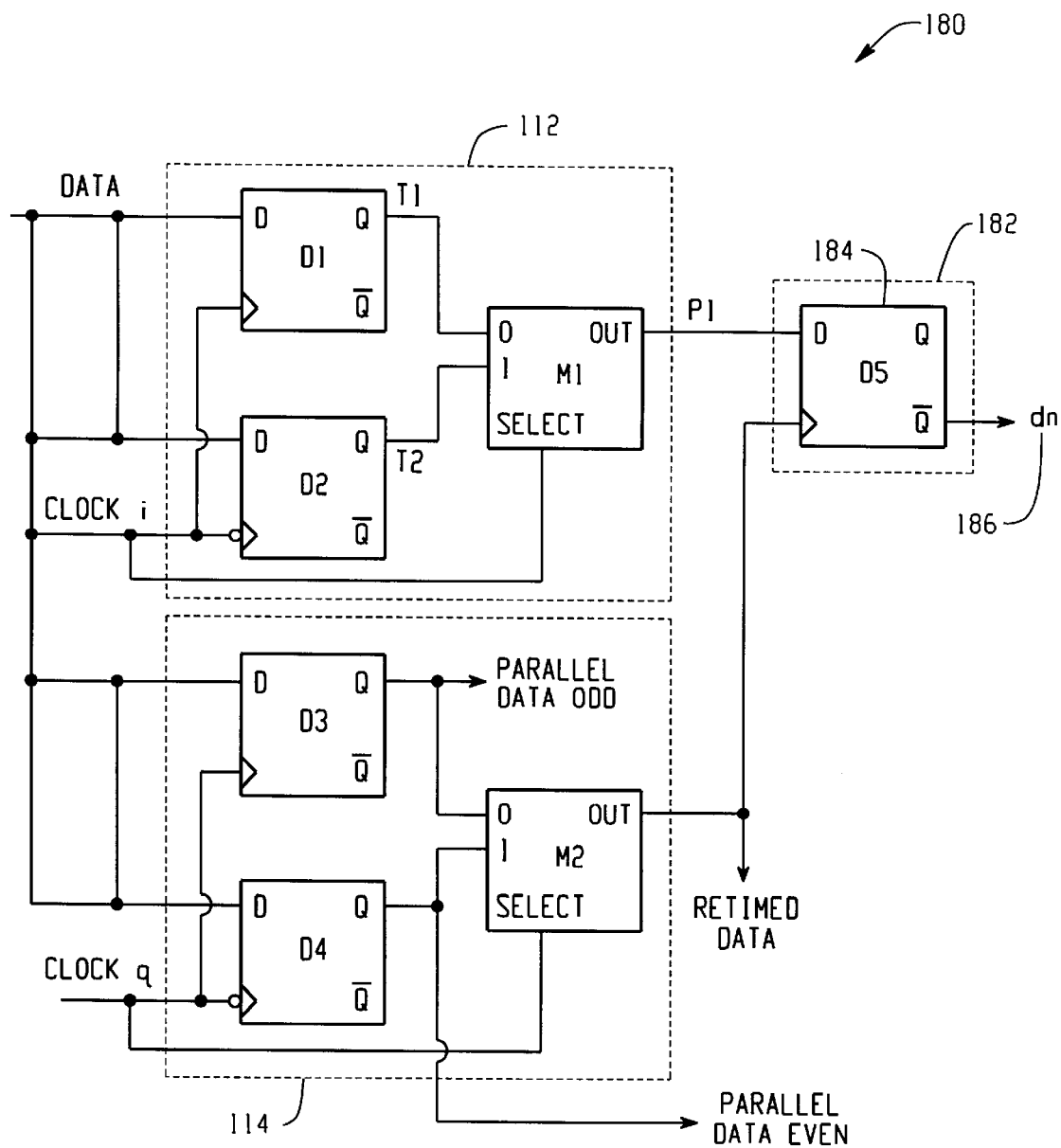
FIG. 10 is an alternative embodiment of a half clock-rate, non-linear phase detector.

FIG. 10 is one alternative embodiment of a half clock-rate, non-linear phase detector 180. Similar to the half clock-rate, non-linear phase detector 110 described above with reference to FIG. 7, this alternative embodiment 180 includes two timing stages 112, 114, and a phase synchronization stage 182. The two timing stages 112, 114 preferably operate the same as in the embodiment described above with reference to FIG. 7. The phase synchronization stage 182 in this alternative embodiment 180, however, preferably includes only one latch (D5) 184. The latch (D5) 184 in this alternative embodiment 180 preferably operates similarly to the fifth latch (D5) 136 described above, except the inverted output (Q) from the latch (D5) 184 serves as the phase control output signal (dn) 186. Similar to the phase detector circuit 90 described above with reference to FIG. 6, this alternative embodiment 180 may, for example, be used for clock and data recovery in a system in which the input data signal 46 is a RZ (return to zero) or CMI (coded mark inversion) coded signal, as well as systems utilizing a NRZ data stream. In addition, this alternative embodiment 180 is not sensitive to duty cycle distortion that may be present in the input data signal 46.

In another alternative embodiment, the non-linear phase detector 180 shown in FIG. 10 may be modified to update the phase control signal (dn) on the falling edge of the retimed data signal 132. This falling-edge-triggered embodiment may be achieved by inverting the clock input to the latch (D5) 184, and utilizing the true output (Q) as the phase control signal (dn).

This written description uses examples to disclose the invention, including the best mode, and also to enable any person skilled in the art to make and use the invention. The patentable scope of the invention is defined by the claims, and may include other examples that occur to those skilled in the art.

We claim:

1. A non-linear phase detector, comprising:
    a retiming stage coupled to a data signal and a recovered clock signal, wherein the retiming stage is triggered by the recovered clock signal and samples the data signal to generate a retimed data signal and a clock synchronization signal; and
    a phase synchronization stage coupled to the retimed data signal and the clock synchronization signal, wherein the phase synchronization stage is triggered by the retimed data signal and samples the clock synchronization signal to generate a phase control signal;
    wherein the non-linear phase detector is configured as a phase detector in a clock and data recovery circuit.

2. The non-linear phase detector of claim 1, wherein the retiming stage comprises:
    a first latch coupled to the data signal and the recovered clock signal that samples the data signal on a rising edge of the recovered clock signal to generate the retimed data signal; and
    a second latch coupled to the data signal and the recovered clock signal that samples the data signal on a falling edge of the recovered clock signal to generate the clock synchronization signal.

3. The non-linear phase detector of claim 2, wherein the first and second latches are D-type flip-flops.

4. The non-linear phase detector of claim 3, wherein the recovered clock signal coupled to the second latch is inverted.

5. The non-linear phase detector of claim 1, wherein the phase synchronization stage comprises:
a latch coupled to the retimed data signal and the clock synchronization signal that samples the clock synchronization signal on a rising edge of the retimed data signal to generate the phase control signal.

6. The non-linear phase detector of claim 5, wherein the latch is a D-type flip-flop, and wherein the phase control signal in an inverted output ($\overline{Q}$) of the D-type flip flop.

7. The non-linear phase detector of claim 1, wherein the phase synchronization stage comprises:
a latch coupled to the retimed data signal and the clock synchronization signal that samples the clock synchronization signal on a falling edge of the retimed data signal to generate the phase control signal.

8. The non-linear phase detector of claim 7, wherein the latch is a D-type flip-flop, and wherein the phase control signal in a true output (Q) of the D-type flip flop.

9. The non-linear phase detector of claim 1, wherein the phase synchronization stage is a dual-edge triggered flip-flop.

10. The non-linear phase detector of claim 1, wherein the phase synchronization stage comprises:
a first latch coupled to the retimed data signal and the clock synchronization signal that samples the clock synchronization signal on a rising edge of the retimed data signal to generate a first sync signal;
a second latch coupled to the retimed data signal and the clock synchronization signal that samples the clock synchronization signal on a falling edge of the retimed data signal to generate a second sync signal; and
a multiplexer coupled to the first and second sync signals that generates the phase control signal.

11. The non-linear phase detector of claim 10, wherein the retimed data signal coupled to the second latch is inverted.

12. The non-linear phase detector of claim 11, wherein the first latch and the second latch are D-type flip flops.

13. The non-linear phase detector of claim 12, wherein the first sync signal is an inverted output ($\overline{Q}$) of the first latch and the second sync signal is a true output (Q) of the second latch.

14. The non-linear phase detector of claim 13, wherein the multiplexer is a two-line to one-line data multiplexer having a first data input coupled to the first sync signal, a second data input coupled to the second sync signal, and a select input coupled to the retimed data signal, wherein the select input controls whether the multiplexer selects the first data input or the second data input to generate the phase control signal.

15. The non-linear phase detector of claim 1, wherein the recovered clock signal is a differential signal.

16. The non-linear phase detector of claim 15, wherein the retiming stage is implemented using one or more differential circuit elements.

17. The non-linear phase detector of claim 15, wherein the phase synchronization stage is implemented using one or more differential circuit elements.

18. A non-linear phase detector, comprising:
a retiming stage coupled to a data signal and a recovered clock signal, wherein the retiming stage is triggered by the recovered clock signal and samples the data signal to generate a retimed data signal and a clock synchronization signal; and
a phase synchronization stage coupled to the retimed data signal and the clock synchronization signal, wherein the phase synchronization stage is triggered by the retimed data signal and samples the clock synchronization signal to generate a phase control signal;
wherein the non-linear phase detector is configured as a phase detector in a frequency synthesizer.

19. The non-linear phase detector of claim 18, wherein the retiming stage comprises:
a first latch coupled to the data signal and the recovered clock signal that samples the data signal on a rising edge of the recovered clock signal to generate the retimed data signal; and
a second latch coupled to the data signal and the recovered clock signal that samples the data signal on a falling edge of the recovered clock signal to generate the clock synchronization signal.

20. The non-linear phase detector of claim 19, wherein the first and second latches are D-type flip-flops.

21. The non-linear phase detector of claim 20, wherein the recovered clock signal coupled to the second latch is inverted.

22. The non-linear phase detector of claim 18, wherein the phase synchronization stage comprises:
a latch coupled to the retimed data signal and the clock synchronization signal that samples the clock synchronization signal on a rising edge of the retimed data signal to generate the phase control signal.

23. The non-linear phase detector of claim 22, wherein the latch is a D-type flip-flop, and wherein the phase control signal in an inverted output ($\overline{Q}$) of the D-type flip flop.

24. The non-linear phase detector of claim 18, wherein the phase synchronization stage comprises:
a latch coupled to the retimed data signal and the clock synchronization signal that samples the clock synchronization signal on a falling edge of the retimed data signal to generate the phase control signal.

25. The non-linear phase detector of claim 24, wherein the latch is a D-type flip-flop, and wherein the phase control signal in a true output (Q) of the D-type flip flop.

26. The non-linear phase detector of claim 18, wherein the phase synchronization stage is a dual-edge triggered flip-flop.

27. The non-linear phase detector of claim 18, wherein the phase synchronization stage comprises:
a first latch coupled to the retimed data signal and the clock synchronization signal that samples the clock synchronization signal on a rising edge of the retimed data signal to generate a first sync signal;
a second latch coupled to the retimed data signal and the clock synchronization signal that samples the clock synchronization signal on a falling edge of the retimed data signal to generate a second sync signal; and
a multiplexer coupled to the first and second sync signals that generates the phase control signal.

28. The non-linear phase detector of claim 27, wherein the retimed data signal coupled to the second latch is inverted.

29. The non-linear phase detector of claim 28, wherein the first latch and the second latch are D-type flip flops.

30. The non-linear phase detector of claim 29, wherein the first sync signal is an inverted output ($\overline{Q}$) of the first latch and the second sync signal is a true output (Q) of the second latch.

31. The non-linear phase detector of claim 30, wherein the multiplexer is a two-line to one-line data multiplexer having a first data input coupled to the first sync signal, a second data input coupled to the second sync signal, and a select input coupled to the retimed data signal, wherein the select input controls whether the multiplexer selects the first data input or the second data input to generate the phase control signal.

32. The non-linear phase detector of claim 18, wherein the recovered clock signal is a differential signal.

33. The non-linear phase detector of claim 32, wherein the retiming stage is implemented using one or more differential circuit elements.

34. The non-linear phase detector of claim 32, wherein the phase synchronization stage is implemented using one or more differential circuit elements.

35. A non-linear phase detector, comprising:
    a retiming stage coupled to a data signal and a recovered clock signal, wherein the retiming stage is triggered by the recovered clock signal and samples the data signal to generate a retimed data signal and a clock synchronization signal; and
    a phase synchronization stage coupled to the retimed data signal and the clock synchronization signal, wherein the phase synchronization stage is triggered by the retimed data signal and samples the clock synchronization signal to generate a phase control signal;
    wherein the non-linear phase detector is configured as a phase detector in a delay locked loop (DLL).

36. The non-linear phase detector of claim 35, wherein the retiming stage comprises:
    a first latch coupled to the data signal and the recovered clock signal that samples the data signal on a rising edge of the recovered clock signal to generate the retimed data signal; and
    a second latch coupled to the data signal and the recovered clock signal that samples the data signal on a falling edge of the recovered clock signal to generate the clock synchronization signal.

37. The non-linear phase detector of claim 36, wherein the first and second latches are D-type flip-flops.

38. The non-linear phase detector of claim 37, wherein the recovered clock signal coupled to the second latch is inverted.

39. The non-linear phase detector of claim 35, wherein the phase synchronization stage comprises:
    a latch coupled to the retimed data signal and the clock synchronization signal that samples the clock synchronization signal on a rising edge of the retimed data signal to generate the phase control signal.

40. The non-linear phase detector of claim 39, wherein the latch is a D-type flip-flop, and wherein the phase control signal in an inverted output ($\overline{Q}$) of the D-type flip flop.

41. The non-linear phase detector of claim 35, wherein the phase synchronization stage comprises:
    a latch coupled to the retimed data signal and the clock synchronization signal that samples the clock synchronization signal on a falling edge of the retimed data signal to generate the phase control signal.

42. The non-linear phase detector of claim 41, wherein the latch is a D-type flip-flop, and wherein the phase control signal in a true output (Q) of the D-type flip flop.

43. The non-linear phase detector of claim 35, wherein the phase synchronization stage is a dual-edge triggered flip-flop.

44. The non-linear phase detector of claim 35, wherein the phase synchronization stage comprises:
    a first latch coupled to the retimed data signal and the clock synchronization signal that samples the clock synchronization signal on a rising edge of the retimed data signal to generate a first sync signal;
    a second latch coupled to the retimed data signal and the clock synchronization signal that samples the clock synchronization signal on a falling edge of the retimed data signal to generate a second sync signal; and
    a multiplexer coupled to the first and second sync signals that generates the phase control signal.

45. The non-linear phase detector of claim 44, wherein the retimed data signal coupled to the second latch is inverted.

46. The non-linear phase detector of claim 45, wherein the first latch and the second latch are D-type flip flops.

47. The non-linear phase detector of claim 46, wherein the first sync signal is an inverted output ($\overline{Q}$) of the first latch and the second sync signal is a true output (Q) of the second latch.

48. The non-linear phase detector of claim 47, wherein the multiplexer is a two-line to one-line data multiplexer having a first data input coupled to the first sync signal, a second data input coupled to the second sync signal, and a select input coupled to the retimed data signal, wherein the select input controls whether the multiplexer selects the first data input or the second data input to generate the phase control signal.

49. The non-linear phase detector of claim 35, wherein the recovered clock signal is a differential signal.

50. The non-linear phase detector of claim 49, wherein the retiming stage is implemented using one or more differential circuit elements.

51. The non-linear phase detector of claim 49, wherein the phase synchronization stage is implemented using one or more differential circuit elements.

52. A non-linear phase detector, comprising:
    a first retiming stage coupled to a data signal and a first clock signal having a first phase, wherein the first retiming stage is triggered by the first clock signal to generate a clock synchronization signal;
    a second retiming stage coupled to the data signal and a second clock signal having a second phase, wherein the second retiming stage is triggered by the second clock signal to generate a retimed data signal; and
    a phase synchronization stage coupled to the retiming signal and the clock synchronization signal, wherein the phase synchronization stage is triggered by the retimed data signal to generate a phase control signal;
    wherein the non-linear phase detector is configured as a phase detector in a clock and data recovery circuit.

53. The non-linear phase detector of claim 52, wherein the first clock signal is an in-phase clock signal and the second clock signal is a quadrature-phase clock signal.

54. The non-linear phase detector of claim 52, wherein the first clock signal is a quadrature-phase clock signal and the second clock signal is an in-phase clock signal.

55. The non-linear phase detector of claim 52, wherein the first and second retiming stages are dual-edge triggered flip-flops.

56. The non-linear phase detector of claim 52, wherein the first retiming stage comprises:
    a first latch coupled to the data signal and the first clock signal that samples the data signal on a rising edge of the first clock signal to generate a first timing signal;
    a second latch coupled to the data signal and the first clock signal that samples the data signal on a falling edge of the first clock signal to generate a second timing signal; and a multiplexer having a first data input coupled to the first timing signal, a second data input coupled to the second timing signal, and a select input coupled to the first clock signal, wherein the select input controls whether the multiplexer samples the first data input or the second data input to generate the clock synchronization signal.

57. The non-linear phase detector of claim 56, wherein the first and second latches are D-Type flip-flops and the multiplexer is a two-line to one-line data multiplexer.

58. The non-linear phase detector of claim 57, wherein the first clock coupled to the second latch is inverted.

59. The non-linear phase detector of claim 52, wherein the second retiming stage comprises:
   a first latch coupled to the data signal and the second clock signal that samples the data signal on a rising edge of the second clock signal to generate an odd parallel data signal;
   a second latch coupled to the data signal and the second clock signal that samples the data signal on a falling edge of the second clock signal to generate an even parallel data signal; and
   a multiplexer having a first data input coupled to the first timing signal, a second data input coupled to the second timing signal, and a select input coupled to the second clock signal, wherein the select input controls whether the multiplexer samples the first data input or the second data input to generate the retimed data signal.

60. The non-linear phase detector of claim 59, wherein the odd and even parallel data signals are coupled to a two-bit parallel data output from the non-linear phase detector.

61. The non-linear phase detector of claim 59, wherein the first and second latches are D-Type flip-flops and the multiplexer is a two-line to one-line data multiplexer.

62. The non-linear phase detector of claim 52, wherein the second clock coupled to the second latch is inverted.

63. The non-linear phase detector of claim 52, wherein the phase synchronization stage comprises:
   a latch coupled to the retimed data signal and the clock synchronization signal that samples the clock synchronization signal on the rising edge of the retimed data signal to generate the phase control signal.

64. The non-linear phase detector of claim 52, wherein the phase synchronization stage comprises:
   a latch coupled to the retimed data signal and the clock synchronization signal that samples the clock synchronization signal on the falling edge of the retimed data signal to generate the phase control signal.

65. The non-linear phase detector of claim 52, wherein the phase synchronization stage is a dual-edge triggered flip-flop.

66. The non-linear phase detector of claim 52, wherein the phase synchronization stage comprises:
   a first latch coupled to the retimed data signal and the clock synchronization signal that samples the clock synchronization signal on a rising edge of the retimed data signal to generate a first sync signal;
   a second latch coupled to the retimed data signal and the clock synchronization signal that samples the clock synchronization signal on a falling edge of the retimed data signal to generate a second sync signal; and
   a multiplexer having a first data input coupled to the first sync signal, a second data input coupled to the second sync signal, and a select input coupled to the retimed data signal, wherein the select input controls whether the multiplexer samples the first data input or the second data input to generate the phase control signal.

67. The non-linear phase detector of claim 66, wherein the first and second latches are D-Type flip-flops and the multiplexer is a two-line to one-line data multiplexer.

68. The non-linear phase detector of claim 66, wherein the retimed data signal coupled to the second latch is inverted.

69. The non-linear phase detector of claim 52, wherein the first and second clock signals are differential signals.

70. The non-linear phase detector of claim 69, wherein the first retiming stage and the second retiming stage are each implemented using one or more differential circuit elements.

71. The non-linear phase detector of claim 69, wherein the phase synchronization stage is implemented using one or more differential circuit elements.

72. A non-linear phase detector, comprising:
   a first retiming stage coupled to a data signal and a first clock signal having a first phase, wherein the first retiming stage is triggered by the first clock signal to generate a clock synchronization signal;
   a second retiming stage coupled to the data signal and a second clock signal having a second phase, wherein the second retiming stage is triggered by the second clock signal to generate a retimed data signal; and
   a phase synchronization stage coupled to the retiming signal and the clock synchronization signal, wherein the phase synchronization stage is triggered by the retimed data signal to generate a phase control signal;
   wherein the non-linear phase detector is configured as a phase detector in a frequency synthesizer.

73. The non-linear phase detector of claim 72, wherein the first clock signal is an in-phase clock signal and the second clock signal is a quadrature-phase clock signal.

74. The non-linear phase detector of claim 72, wherein the first clock signal is a quadrature-phase clock signal and the second clock signal is an in-phase clock signal.

75. The non-linear phase detector of claim 72, wherein the first and second retiming stages are dual-edge triggered flip-flops.

76. The non-linear phase detector of claim 72, wherein the first retiming stage comprises:
   a first latch coupled to the data signal and the first clock signal that samples the data signal on a rising edge of the first clock signal to generate a first timing signal;
   a second latch coupled to the data signal and the first clock signal that samples the data signal on a falling edge of the first clock signal to generate a second timing signal; and
   a multiplexer having a first data input coupled to the first timing signal, a second data input coupled to the second timing signal, and a select input coupled to the first clock signal, wherein the select input controls whether the multiplexer samples the first data input or the second data input to generate the clock synchronization signal.

77. The non-linear phase detector of claim 76, wherein the first and second latches are D-Type flip-flops and the multiplexer is a two-line to one-line data multiplexer.

78. The non-linear phase detector of claim 77, wherein the first clock coupled to the second latch is inverted.

79. The non-linear phase detector of claim 72, wherein the second retiming stage comprises:
   a first latch coupled to the data signal and the second clock signal that samples the data signal on a rising edge of the second clock signal to generate an odd parallel data signal;
   a second latch coupled to the data signal and the second clock signal that samples the data signal on a falling edge of the second clock signal to generate an even parallel data signal; and a multiplexer having a first data input coupled to the first timing signal, a second data input coupled to the second timing signal, and a select input coupled to the second clock signal, wherein the select input controls whether the multiplexer samples the first data input or the second data input to generate the retimed data signal.

80. The non-linear phase detector of claim 79, wherein the odd and even parallel data signals are coupled to a two-bit parallel data output from the non-linear phase detector.

81. The non-linear phase detector of claim 79, wherein the first and second latches are D-Type flip-flops and the multiplexer is a two-line to one-line data multiplexer.

82. The non-linear phase detector of claim 79, wherein the second clock coupled to the second latch is inverted.

83. The non-linear phase detector of claim 72, wherein the phase synchronization stage comprises:

a latch coupled to the retimed data signal and the clock synchronization signal that samples the clock synchronization signal on the rising edge of the retimed data signal to generate the phase control signal.

84. The non-linear phase detector of claim 72, wherein the phase synchronization stage comprises:

a latch coupled to the retimed data signal and the clock synchronization signal that samples the clock synchronization signal on the falling edge of the retimed data signal to generate the phase control signal.

85. The non-linear phase detector of claim 72, wherein the phase synchronization stage is a dual-edge triggered flip-flop.

86. The non-linear phase detector of claim 72, wherein the phase synchronization stage comprises:

a first latch coupled to the retimed data signal and the clock synchronization signal that samples the clock synchronization signal on a rising edge of the retimed data signal to generate a first sync signal;

a second latch coupled to the retimed data signal and the clock synchronization signal that samples the clock synchronization signal on a falling edge of the retimed data signal to generate a second sync signal; and a multiplexer having a first data input coupled to the first sync signal, a second data input coupled to the second sync signal, and a select input coupled to the retimed data signal, wherein the select input controls whether the multiplexer samples the first data input or the second data input to generate the phase control signal.

87. The non-linear phase detector of claim 86, wherein the first and second latches are D-Type flip-flops and the multiplexer is a two-line to one-line data multiplexer.

88. The non-linear phase detector of claim 86, wherein the retimed data signal coupled to the second latch is inverted.

89. The non-linear phase detector of claim 72, wherein the first and second clock signals are differential signals.

90. The non-linear phase detector of claim 89, wherein the first retiming stage and the second retiming stage are each implemented using one or more differential circuit elements.

91. The non-linear phase detector of claim 89, wherein the phase synchronization stage is implemented using one or more differential circuit elements.

92. A non-linear phase detector, comprising:

a first retiming stage coupled to a data signal and a first clock signal having a first phase, wherein the first retiming stage is triggered by the first clock signal to generate a clock synchronization signal;

a second retiming stage coupled to the data signal and a second clock signal having a second phase, wherein the second retiming stage is triggered by the second clock signal to generate a retimed data signal; and a phase synchronization stage coupled to the retiming signal and the clock synchronization signal, wherein the phase synchronization stage is triggered by the retimed data signal to generate a phase control signal;

wherein the non-linear phase detector is configured as a phase detector in a delay locked loop (DLL).

93. The non-linear phase detector of claim 92, wherein the first clock signal is an in-phase clock signal and the second clock signal is a quadrature-phase clock signal.

94. The non-linear phase detector of claim 92, wherein the first clock signal is a quadrature-phase clock signal and the second clock signal is an in-phase clock signal.

95. The non-linear phase detector of claim 92, wherein the first and second retiming stages are dual-edge triggered flip-flops.

96. The non-linear phase detector of claim 92, wherein the first retiming stage comprises:

a first latch coupled to the data signal and the first clock signal that samples the data signal on a rising edge of the first clock signal to generate a first timing signal;

a second latch coupled to the data signal and the first clock signal that samples the data signal on a falling edge of the first clock signal to generate a second timing signal; and a multiplexer having a first data input coupled to the first timing signal, a second data input coupled to the second timing signal, and a select input coupled to the first clock signal, wherein the select input controls whether the multiplexer samples the first data input or the second data input to generate the clock synchronization signal.

97. The non-linear phase detector of claim 96, wherein the first and second latches are D-Type flip-flops and the multiplexer is a two-line to one-line data multiplexer.

98. The non-linear phase detector of claim 97, wherein the first clock coupled to the second latch is inverted.

99. The non-linear phase detector of claim 92, wherein the second retiming stage comprises:

a first latch coupled to the data signal and the second clock signal that samples the data signal on a rising edge of the second clock signal to generate an odd parallel data signal;

a second latch coupled to the data signal and the second clock signal that samples the data signal on a falling edge of the second clock signal to generate an even parallel data signal; and a multiplexer having a first data input coupled to the first timing signal, a second data input coupled to the second timing signal, and a select input coupled to the second clock signal, wherein the select input controls whether the multiplexer samples the first data input or the second data input to generate the retimed data signal.

100. The non-linear phase detector of claim 99, wherein the odd and even parallel data signals are coupled to a two-bit parallel data output from the non-linear phase detector.

101. The non-linear phase detector of claim 99, wherein the first and second latches are D-Type flip-flops and the multiplexer is a two-line to one-line data multiplexer.

102. The non-linear phase detector of claim 99, wherein the second clock coupled to the second latch is inverted.

103. The non-linear phase detector of claim 92, wherein the phase synchronization stage comprises:

a latch coupled to the retimed data signal and the clock synchronization signal that samples the clock synchronization signal on the rising edge of the retimed data signal to generate the phase control signal.

104. The non-linear phase detector of claim 92, wherein the phase synchronization stage comprises:

a latch coupled to the retimed data signal and the clock synchronization signal that samples the clock synchronization signal on the falling edge of the retimed data signal to generate the phase control signal.

105. The non-linear phase detector of claim 92, wherein the phase synchronization stage is a dual-edge triggered flip-flop.

106. The non-linear phase detector of claim 92, wherein the phase synchronization stage comprises:

a first latch coupled to the retimed data signal and the clock synchronization signal that samples the clock synchronization signal on a rising edge of the retimed data signal to generate a first sync signal;

a second latch coupled to the retimed data signal and the clock synchronization signal that samples the clock synchronization signal on a falling edge of the retimed data signal to generate a second sync signal; and a multiplexer having a first data input coupled to the first sync signal, a second data input coupled to the second sync signal, and a select input coupled to the retimed data signal, wherein the select input controls whether the multiplexer samples the first data input or the second data input to generate the phase control signal.

107. The non-linear phase detector of claim 106, wherein the first and second latches are D-Type flip-flops and the multiplexer is a two-line to one-line data multiplexer.

108. The non-linear phase detector of claim 106, wherein the retimed data signal coupled to the second latch is inverted.

109. The non-linear phase detector of claim 92, wherein the first and second clock signals are differential signals.

110. The non-linear phase detector of claim 109, wherein the first retiming stage and the second retiming stage are each implemented using one or more differential circuit elements.

111. The non-linear phase detector of claim 109, wherein the phase synchronization stage is implemented using one or more differential circuit elements.

\* \* \* \* \*